(12) United States Patent
Chang et al.

(10) Patent No.: US 8,912,711 B1
(45) Date of Patent: Dec. 16, 2014

(54) THERMAL STRESS RESISTANT RESONATOR, AND A METHOD FOR FABRICATING SAME

(75) Inventors: David T. Chang, Calabasas, CA (US); Tsung-Yuan Hsu, Westlake Village, CA (US)

(73) Assignee: HRL Laboratories, LLC, Malibu, CA (US)

( * ) Notice: Subject to any disclaimer, the term of this patent is extended or adjusted under 35 U.S.C. 154(b) by 84 days.

(21) Appl. No.: 12/820,761

(22) Filed: Jun. 22, 2010

(51) Int. Cl.
*H01L 41/053* (2006.01)
*H03H 9/02* (2006.01)

(52) U.S. Cl.
USPC .......................... 310/367; 310/320; 310/365

(58) Field of Classification Search
USPC ................... 310/320, 348, 365–367
See application file for complete search history.

(56) References Cited

U.S. PATENT DOCUMENTS

| | | |
|---|---|---|
| 392,650 A | 11/1888 | Watrous |
| 2,487,165 A | 11/1949 | Miller |
| 3,390,287 A | 6/1968 | Sonderegger |
| 3,766,616 A | 10/1973 | Staudte |
| 4,364,016 A | 12/1982 | Tanski |
| 4,426,769 A | 1/1984 | Grabbe |
| 4,442,574 A | 4/1984 | Wanuga et al. |
| 4,447,753 A | 5/1984 | Ochiai |
| 4,618,262 A | 10/1986 | Maydan et al. |
| 4,870,313 A | 9/1989 | Hirama et al. |
| 4,898,031 A | 2/1990 | Oikawa et al. |
| 4,944,836 A | 7/1990 | Beyer et al. |
| 5,203,208 A | 4/1993 | Bernstein |
| 5,226,321 A | 7/1993 | Varnham et al. |
| 5,260,596 A | 11/1993 | Dunn et al. |
| 5,421,312 A | 6/1995 | Dawson |
| 5,480,747 A | 1/1996 | Vasudev |
| 5,530,408 A | 6/1996 | Vig et al. |
| 5,552,016 A | 9/1996 | Ghanayem |
| 5,578,976 A | 11/1996 | Yao et al. |
| 5,589,724 A | 12/1996 | Satoh et al. |
| 5,604,312 A | 2/1997 | Lutz |
| 5,605,490 A | 2/1997 | Laffey et al. |
| 5,644,139 A | 7/1997 | Allen |
| 5,646,346 A | 7/1997 | Okada |
| 5,648,849 A | 7/1997 | Canteloup et al. |
| 5,658,418 A | 8/1997 | Coronel et al. |
| 5,665,915 A | 9/1997 | Kobayashi et al. |
| 5,666,706 A | 9/1997 | Tomita et al. |
| 5,668,057 A | 9/1997 | Eda et al. |
| 5,728,936 A | 3/1998 | Lutz |

(Continued)

FOREIGN PATENT DOCUMENTS

| | | |
|---|---|---|
| DE | 4442033 | 5/1996 |
| DE | 19719601 | 11/1998 |

(Continued)

OTHER PUBLICATIONS

U.S. Appl. No. 11/502,336, filed Aug. 9, 2006, Chang.

(Continued)

*Primary Examiner* — Derek Rosenau

(74) *Attorney, Agent, or Firm* — Ladas & Parry

(57) ABSTRACT

In an embodiment, a thermal stress resistant resonator is disclosed. The thermal stress resistant resonator may include or comprise a piezoelectric member having one or more non-linear piezoelectric support members extending there from.

12 Claims, 12 Drawing Sheets

(56) References Cited

U.S. PATENT DOCUMENTS

| | | | |
|---|---|---|---|
| 5,783,749 A | 7/1998 | Lee et al. |
| 5,894,090 A | 4/1999 | Tang et al. |
| 5,905,202 A | 5/1999 | Kubena et al. |
| 5,920,012 A | 7/1999 | Pinson |
| 5,928,532 A | 7/1999 | Koshimizu et al. |
| 5,942,445 A | 8/1999 | Kato et al. |
| 5,959,206 A | 9/1999 | Ryrko |
| 5,981,392 A | 11/1999 | Oishi |
| 5,987,985 A | 11/1999 | Okada |
| 6,009,751 A | 1/2000 | Ljung |
| 6,044,705 A | 4/2000 | Neukermans et al. |
| 6,049,702 A | 4/2000 | Tham et al. |
| 6,081,334 A | 6/2000 | Grimbergen et al. |
| 6,089,088 A | 7/2000 | Charvet |
| 6,094,985 A | 8/2000 | Kapels et al. |
| 6,114,801 A | 9/2000 | Tanaka |
| 6,145,380 A | 11/2000 | MacGugan et al. |
| 6,151,964 A | 11/2000 | Nakajima |
| 6,155,115 A | 12/2000 | Ljung |
| 6,164,134 A | 12/2000 | Cargille |
| 6,182,352 B1 | 2/2001 | Deschenes et al. |
| 6,196,059 B1 | 3/2001 | Kosslinger |
| 6,204,737 B1 | 3/2001 | Ella |
| 6,207,008 B1 | 3/2001 | Kijima |
| 6,236,145 B1 * | 5/2001 | Biernacki ............... 310/346 |
| 6,250,157 B1 | 6/2001 | Touge |
| 6,263,552 B1 | 7/2001 | Takeuchi et al. |
| 6,282,958 B1 | 9/2001 | Fell et al. |
| 6,289,733 B1 | 9/2001 | Challoner et al. |
| 6,297,064 B1 | 10/2001 | Koshimizu |
| 6,349,597 B1 | 2/2002 | Folkmer et al. |
| 6,367,326 B1 | 4/2002 | Okada |
| 6,367,786 B1 | 4/2002 | Gutierrez et al. |
| 6,413,682 B1 | 7/2002 | Shibano et al. |
| 6,417,925 B1 | 7/2002 | Naya |
| 6,424,418 B2 | 7/2002 | Kawabata et al. |
| 6,426,296 B1 | 7/2002 | Okojie |
| 6,432,824 B2 | 8/2002 | Yanagisawa |
| 6,481,284 B2 | 11/2002 | Geen et al. |
| 6,481,285 B1 | 11/2002 | Shkel et al. |
| 6,492,195 B2 | 12/2002 | Nakanishi |
| 6,513,380 B2 | 2/2003 | Reeds et al. |
| 6,514,767 B1 | 2/2003 | Natan |
| 6,515,278 B2 | 2/2003 | Wine et al. |
| 6,571,629 B1 | 6/2003 | Kipp |
| 6,584,845 B1 | 7/2003 | Gutierrez et al. |
| 6,614,529 B1 | 9/2003 | Tang |
| 6,621,158 B2 | 9/2003 | Martin et al. |
| 6,627,067 B1 | 9/2003 | Branton et al. |
| 6,628,177 B2 | 9/2003 | Clark et al. |
| 6,629,460 B2 | 10/2003 | Challoner |
| 6,651,027 B2 | 11/2003 | McCall |
| 6,686,807 B1 | 2/2004 | Giousouf et al. |
| 6,710,681 B2 | 3/2004 | Figueredo et al. |
| 6,715,352 B2 | 4/2004 | Tracy |
| 6,744,335 B2 | 6/2004 | Ryhanen |
| 6,750,728 B2 | 6/2004 | Takahashi |
| 6,756,304 B1 | 6/2004 | Robert |
| 6,768,396 B2 | 7/2004 | Klee |
| 6,796,179 B2 | 9/2004 | Bae et al. |
| 6,806,557 B2 | 10/2004 | Ding |
| 6,815,228 B2 | 11/2004 | Usui et al. |
| 6,856,217 B1 | 2/2005 | Clark et al. |
| 6,862,398 B2 | 3/2005 | Elkind et al. |
| 6,883,374 B2 | 4/2005 | Fell et al. |
| 6,915,215 B2 | 7/2005 | M'Closkey et al. |
| 6,933,164 B2 | 8/2005 | Kubena |
| 6,943,484 B2 | 9/2005 | Clark et al. |
| 6,985,051 B2 | 1/2006 | Nguyen et al. |
| 7,057,331 B2 | 6/2006 | Shimodaira et al. |
| 7,118,657 B2 | 10/2006 | Golovchenko et al. |
| 7,152,290 B2 | 12/2006 | Junhua et al. |
| 7,168,318 B2 | 1/2007 | Challoner et al. |
| 7,211,933 B2 | 5/2007 | Kawakubo |
| 7,224,245 B2 | 5/2007 | Song et al. |
| 7,232,700 B1 | 6/2007 | Kubena |
| 7,234,214 B2 | 6/2007 | Xu |
| 7,237,315 B2 | 7/2007 | Kubena |
| 7,295,088 B2 | 11/2007 | Nguyen et al. |
| 7,317,354 B2 | 1/2008 | Lee |
| 7,446,628 B2 | 11/2008 | Morris, III |
| 7,459,099 B2 | 12/2008 | Kubena et al. |
| 7,459,992 B2 | 12/2008 | Matsuda et al. |
| 7,479,846 B2 | 1/2009 | Inoue et al. |
| 7,490,390 B2 | 2/2009 | Kawakubo et al. |
| 7,543,496 B2 | 6/2009 | Ayazi |
| 7,551,054 B2 | 6/2009 | Mizuno et al. |
| 7,555,824 B2 | 7/2009 | Chang |
| 7,557,493 B2 | 7/2009 | Fujimoto |
| 7,559,130 B2 | 7/2009 | Kubena et al. |
| 7,564,177 B2 | 7/2009 | Yoshimatsu |
| 7,579,748 B2 | 8/2009 | Kuroda |
| 7,579,926 B2 | 8/2009 | Jhung |
| 7,581,443 B2 | 9/2009 | Kubena |
| 7,663,196 B2 | 2/2010 | Liu et al. |
| 7,671,427 B2 | 3/2010 | Kim et al. |
| 7,675,224 B2 * | 3/2010 | Tanaya ............... 310/370 |
| 7,690,095 B2 | 4/2010 | Takahashi |
| 7,750,535 B2 | 7/2010 | Kubena |
| 7,757,393 B2 | 7/2010 | Ayazi et al. |
| 7,791,432 B2 | 9/2010 | Piazza et al. |
| 7,802,356 B1 | 9/2010 | Chang |
| 7,830,074 B2 | 11/2010 | Kubena |
| 7,872,548 B2 | 1/2011 | Nishihara et al. |
| 7,884,930 B2 | 2/2011 | Kirby |
| 7,895,892 B2 | 3/2011 | Aigner |
| 7,994,877 B1 | 8/2011 | Kubena |
| 8,138,016 B2 | 3/2012 | Chang |
| 8,151,640 B1 | 4/2012 | Kubena |
| 8,176,607 B1 | 5/2012 | Kubena |
| 8,522,612 B1 | 9/2013 | Kubena |
| 8,593,037 B1 | 11/2013 | Kubena |
| 2002/0066317 A1 | 6/2002 | Lin |
| 2002/0072246 A1 | 6/2002 | Goo et al. |
| 2002/0074947 A1 | 6/2002 | Tsukamoto |
| 2002/0107658 A1 | 8/2002 | McCall |
| 2002/0185611 A1 | 12/2002 | Menapace et al. |
| 2003/0003608 A1 | 1/2003 | Arikado et al. |
| 2003/0010123 A1 | 1/2003 | Malvern et al. |
| 2003/0029238 A1 | 2/2003 | Challoner |
| 2003/0196490 A1 | 10/2003 | Cardarelli |
| 2003/0205948 A1 | 11/2003 | Lin et al. |
| 2004/0055380 A1 | 3/2004 | Shcheglov et al. |
| 2004/0065864 A1 | 4/2004 | Vogt et al. |
| 2004/0189311 A1 | 9/2004 | Glezer |
| 2004/0211052 A1 | 10/2004 | Kubena et al. |
| 2005/0034822 A1 | 2/2005 | Kim et al. |
| 2005/0062368 A1 * | 3/2005 | Hirasawa et al. ............. 310/370 |
| 2005/0093659 A1 | 5/2005 | Larson et al. |
| 2005/0156309 A1 | 7/2005 | Fujii |
| 2005/0260792 A1 | 11/2005 | Patel |
| 2006/0016065 A1 | 1/2006 | Nagaura |
| 2006/0022556 A1 | 2/2006 | Bail et al. |
| 2006/0055479 A1 | 3/2006 | Okazaki et al. |
| 2006/0066419 A1 | 3/2006 | Iwaki |
| 2006/0139121 A1 | 6/2006 | Jhung |
| 2006/0197619 A1 | 9/2006 | Oishi et al. |
| 2006/0213266 A1 | 9/2006 | French |
| 2006/0252906 A1 | 11/2006 | Godschalx et al. |
| 2006/0255691 A1 * | 11/2006 | Kuroda et al. ................ 310/348 |
| 2007/0017287 A1 | 1/2007 | Kubena |
| 2007/0034005 A1 | 2/2007 | Acar et al. |
| 2007/0205839 A1 | 9/2007 | Kubena et al. |
| 2007/0220971 A1 | 9/2007 | Ayazi |
| 2007/0240508 A1 | 10/2007 | Watson |
| 2008/0034575 A1 | 2/2008 | Chang et al. |
| 2008/0074661 A1 | 3/2008 | Zhang |
| 2008/0096313 A1 | 4/2008 | Patel |
| 2008/0148846 A1 | 6/2008 | Whelan |
| 2009/0146527 A1 | 6/2009 | Lee et al. |
| 2009/0189294 A1 | 7/2009 | Chang |
| 2010/0020311 A1 | 1/2010 | Kirby |
| 2010/0148803 A1 | 6/2010 | Ohnishi |
| 2011/0107838 A1 | 5/2011 | Suijlen |

(56) References Cited

U.S. PATENT DOCUMENTS

| | | | |
|---|---|---|---|
| 2012/0000288 A1 | 1/2012 | Matsuura | |
| 2012/0212109 A1* | 8/2012 | Yamazaki et al. | 310/370 |
| 2012/0266682 A1 | 10/2012 | Torashima | |

FOREIGN PATENT DOCUMENTS

| | | |
|---|---|---|
| EP | 0 461 761 | 12/1991 |
| EP | 0 531 985 | 3/1993 |
| EP | 1 055 908 | 11/2000 |
| EP | 0 971 208 | 12/2000 |
| JP | 57-091017 | 6/1982 |
| JP | 01129517 | 5/1989 |
| JP | 04-322507 | 11/1992 |
| JP | 5286142 | 11/1993 |
| JP | 06232678 | 8/1994 |
| JP | 06-318533 | 11/1994 |
| JP | 08330878 | 12/1996 |
| JP | 09-247025 | 9/1997 |
| JP | 2003-318685 | 11/2003 |
| JP | 2005-180921 | 7/2005 |
| JP | 2006-352487 | 12/2006 |
| KR | 10-2001-0110428 A | 12/2001 |
| WO | 84-00082 | 1/1984 |
| WO | 96/38710 | 12/1996 |
| WO | 98/15799 | 4/1998 |
| WO | 00/68640 | 11/2000 |
| WO | 01/44823 | 6/2001 |
| WO | 01/74708 | 10/2001 |
| WO | 02/12873 | 2/2002 |
| WO | 2005/121769 | 12/2005 |
| WO | 2006/010206 | 2/2006 |
| WO | 2006/103439 | 10/2006 |

OTHER PUBLICATIONS

U.S. Appl. No. 12/026,486, filed Feb. 5, 2008, Kubena.
U.S. Appl. No. 12/027,247, filed Feb. 6, 2008, Kubena.
U.S. Appl. No. 12/399,680, filed Mar. 6, 2009, Chang.
U.S. Appl. No. 12/575,634, filed Oct. 8, 2009, Kubena.
U.S. Appl. No. 12/488,784, filed Jun. 22, 2009, Kubena.
U.S. Appl. No. 13/410,998, filed Mar. 2, 2012, Kubena.
U.S. Appl. No. 13/434,144, filed Mar. 29, 2012, Kubena.
J.-M. Friedt and E. Carry, "Introduction to the Quartz tuning Fork", American Journal of Physics 75, 415 (Feb. 2, 2007); DOI: 10.1119/1.2711826.
From U.S. Appl. No. 13/434,144 (unpublished, non-publication requested)—Issue Notification dated Nov. 6, 2013—Notice of Allowance dated Jul. 11, 2013.
Greer J.A. et al.., Properties of SAW resonators fabricated on quartz substrates of various qualities; Ultrasonics Symposium, 1994 IEEE, vol. 1, Nov. 1-4, 1994; pp. 31-36.
Abe, Takashi, et al., "One-chip multichannel quartz crystal microbalance (QCM) fabricated by Deep RIE," Sensors and Actuators, vol. 82, pp. 139-143 (2000).
Cleland, A.N., et al., "Fabrication of high frequency nanometer scale mechanical resonators from bulk Si crystals," Applied Physics Letters, vol. 69, No. 18, pp. 2653-2655 (Oct. 28, 1996).
Evoy, S., et al., "Temperature-dependent internal friction in silicon nanoelectromechanical systems," Applied Physics Letters, vol. 77, No. 15, pp. 2397-2399 (Oct. 9, 2000).
Wright et al., "The HRG Applied to a Satellite Attitude Reference System," Guidance and Control, AASAAS, 1994, 86:1-13.
Putty et al., "A Micromachined Vibrating Ring Gyroscope,", Solid State Sensor and Actuator Workshop, Transducer Research Foundation, Hilton Head, 1994, pp. 213-220.
Tang et al., "A Packaged Silicon MEMS Vibratory Gyroscope for Microspacecraft," Proceedings IEEE, 10th Annual Int. Workshop on MEMS, Japan, 1997, pp. 500-505.
Tang et al., "Silicon Bulk Micromachined Vibratory Gyroscope," Jet Propulsion Lab.
Barbour et al., "Micromechanical Silicon Instrument and Systems Development at Draper Laboratory," AIAA Guidance Navigation and Control Conference, 1996, Paper No. 96-3709.
Johnson et al., "Surface Micromachined Angular Rate Sensor," A1995 SAE Conference, Paper No. 950538, pp. 77-83.
Fujita et al., "Disk-shaped bulk micromachined gyroscope with vacuum sealing," Sensors and Actuators A:Physical, vol. 82, May 2000, pp. 198-204.
Skulski et al., "Planar resonator sensor for moisture measurements", Microwaves and Radar, 1998, MIKON '98, 12th International Conf., vol. 3, May 20-22, 1998, pp. 692-695.
Sirbuly, Donald J. et al., Multifunctional Nanowire Evanescent Wave Optical Sensors, Advanced Materials, 2007 (published online. Dec. 5, 2006), 19, pp. 61.
White, Lan M., et al., Increasing the Enhancement of SERS with Dielectric Microsphere Resonators, Spectroscopy-Eugene, Apr. 2006.
Yan, Fei, et al., "Surface-enhanced Raman scattering (SERS) detection for chemical and biological agents," IEEE Sensors Journal, vol. 5, No. 4, Aug. 2005.
Aaltonen, T., et al. "ALD of Rhodium thin films from Rh(acac)$_3$ and Oxygen," Electrochemical and Solid-State Lett. 8, C99 (2005).
Burdess et al., "The Theory of a Piezoelectric Disc Gyroscope", Jul. 1986, IEEE vol. AES 22, No. 4; p. 410-418.
Lin, J.W., et al., "A Robust High-Q Micromachined RF Inductor for RFIC Applications," IEEE Transactions on Electronic Devices, vol. 52, No. 7, pp. 1489-1496 (Jul. 2005).
Park, K.J., et al., "Selective area atomic layer deposition of rhodium and effective work function characterization in capacitor structures," Applied Physics Letters 89, 043111 (2006).
From U.S. Appl. No. 12/034,852—All Restriction Requirements, including that dated Oct. 2, 2009—Notice of Allowance of May 19, 2010—Issue Notification of Sep. 8, 2010.
From U.S. Appl. No. 12/145,678—All Office Actions, including those dated Mar. 26, 2010, Jul. 22, 2009—Notice of Allowance of Jul. 13, 2010—Issue Notification of Jan. 19, 2011.
From U.S. Appl. No. 12/268,309—All Restriction Requirements, including that dated Aug. 20, 2010—All Office Actions, including those dated Nov. 22, 2010,—Notice of Allowance of Apr. 4, 2011—Issue Notification of Jul. 20, 2011.
Notice of Allowance for U.S. Appl. No. 12/831,028 dated Feb. 27, 2014.
Notice of Allowance for U.S. Appl. No. 12/488,784 dated Feb. 20, 2014.

* cited by examiner

THERMAL STRESS RESISTANT RESONATOR, AND A METHOD FOR FABRICATING SAME

STATEMENT REGARDING FEDERALLY SPONSORED RESEARCH

The invention was developed with support from the United States Government under Contract No. 2007-1095726-000. The United States Government has certain rights in the invention.

TECHNICAL FIELD

The present technology relates to the field of resonator devices.

BACKGROUND

Electronic systems have become ubiquitous in many modern societies, wherein these systems may be used to perform various tasks electronically, such as to increase the ease and efficiency with which certain tasks may be carried out. Oftentimes, it is useful in such electronic systems that an electrical signal be created with a particular frequency, such as to provide a stable clock signal for digital integrated circuits.

SUMMARY

This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter.

In an embodiment, a thermal stress resistant resonator is disclosed. The thermal stress resistant resonator may include or comprise a piezoelectric member having one or more non-linear piezoelectric support members extending there from.

Additionally, in one embodiment, a thermal stress resistant resonator is disclosed, wherein the thermal stress resistant resonator may include or comprise a first electrode, a second electrode separated from the first electrode, and a piezoelectric member disposed between the first and second electrodes. The thermal stress resistant resonator may also include or comprise a first spring support member including or comprising: a first non-linear signal line extending from the first electrode, and a first non-linear piezoelectric support member extending from the piezoelectric member, the first non-linear signal line being disposed on or adjacent to the first non-linear piezoelectric support member.

Moreover, in accordance with an embodiment, a thermal stress resistant resonator is disclosed, wherein the thermal stress resistant resonator may include or comprise a first electrode, a second electrode separated from the first electrode, and a quartz member disposed between the first and second electrodes. The thermal stress resistant resonator may also include or comprise a first spring support member including or comprising: a first non-linear signal line extending from the first electrode, and a first non-linear quartz support member extending from the quartz member, the first non-linear signal line being disposed on or adjacent to the first non-linear quartz support member.

Furthermore, in an embodiment, a method of fabricating a thermal stress resistant resonator is disclosed. The method may include or comprise providing first and second electrodes, and disposing a quartz member between the first and second electrodes. The method may also include or comprise providing a first spring support member including or comprising: a first non-linear signal line extending from the first electrode, and a first non-linear quartz support member extending from the quartz member, the first non-linear signal line being disposed on or adjacent to the first non-linear quartz support member.

DESCRIPTION OF THE DRAWINGS

The accompanying drawings, which are incorporated in and form a part of this specification, illustrate embodiments of the present technology, and, together with the Detailed Description, serve to explain principles discussed below.

Figure 1A:
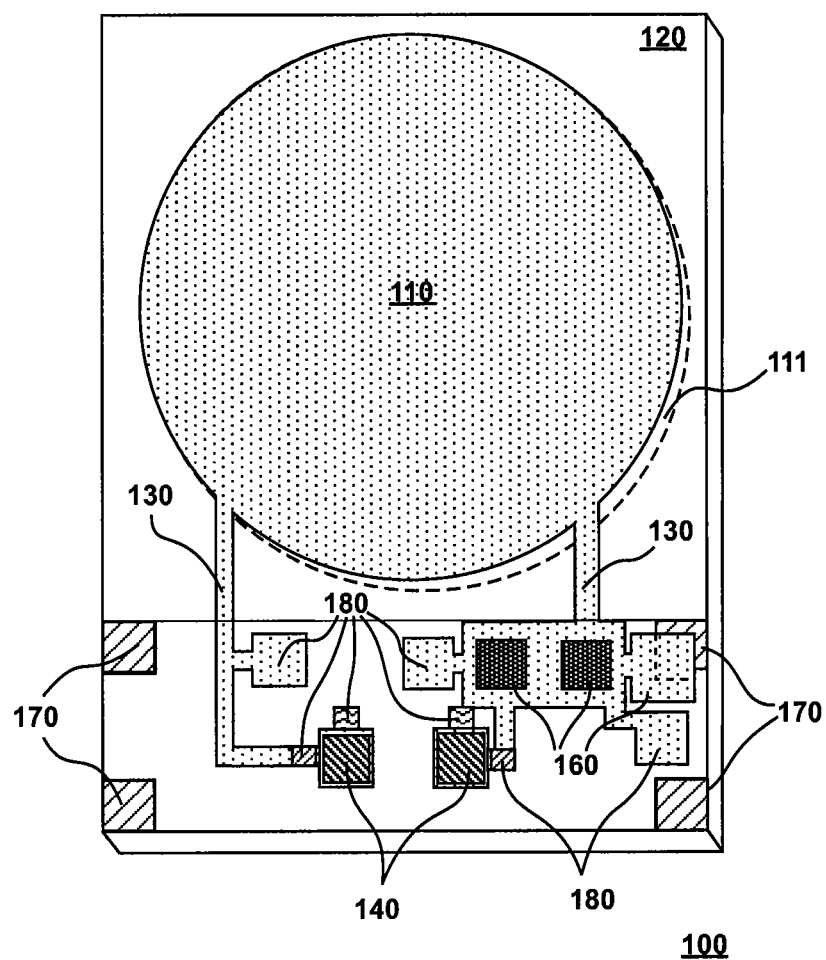
FIG. 1A is a top view of a quartz resonator in accordance with an embodiment.

The drawings referred to in this description are not to be understood as being drawn to scale except if specifically noted, and such drawings are only exemplary in nature.

DETAILED DESCRIPTION

Reference will now be made in detail to embodiments of the present technology, examples of which are illustrated in the accompanying drawings. While the present technology will be described in conjunction with various embodiments, these embodiments are not intended to limit the present technology. Rather, the present technology is to be understood as encompassing alternatives, modifications and equivalents, which may be included within the spirit and scope of the various embodiments as defined by the appended claims.

Furthermore, in the following Detailed Description numerous specific details are set forth in order to provide a thorough understanding of the present technology. However, the present technology may be practiced without these specific details. In other instances, well-known methods, procedures, components, and circuits have not been described in detail so as to not unnecessarily obscure aspects of the exemplary embodiments presented herein.

Overview

Pursuant to an exemplary scenario, the performance of a temperature compensated quartz resonator such as an AT-cut or SC-cut crystal can be adversely affected by large mechanical stresses which can cause frequency shifts and create an effective rotation in the crystal cut angle to nullify the zero temperature coefficient of quartz. Such mechanical stresses are primarily caused by thermal expansion mismatch between the quartz crystal and its substrate and/or package.

An embodiment of the present technology provides a new quartz resonator design that allows extremely low mounting thermal stress even when the resonator is bonded to a substrate with significantly different coefficient of thermal expansion (CTE) from that of quartz. To illustrate, an example provides a resonator device that includes a number of spring shaped feet carved from the same quartz crystal as the active region of the resonator such that the device is fabricated from a single crystal. The device is configured to be attached to a substrate at the tops of the spring shaped feet, which leaves a portion of the device, including the resonator, cantilevered out into space.

It is noted that principles of the present technology may be implemented to fabricate a miniaturized quartz resonator design with the following novel features: ultra low thermal mounting stress for quartz resonators on thermally mismatched substrates; folded spring supports for the active quartz element to create thermal stress isolation; mounting used for quartz resonator packaging or direct integration with an electronic substrate; and a design applicable to resonator mounting/bonding processes using adhesive, metal and solder bonds. It is further noted that principles of the present technology may be applied to various high-performance quartz oscillator and filter programs and applications.

Various exemplary embodiments of the present technology will now be discussed. It is noted, however, that the present technology is not limited to these exemplary embodiments, and that the present technology also includes obvious variations of the exemplary embodiments and implementations described herein.

Exemplary Structures

Pursuant to an exemplary scenario, quartz is a material of choice for high-stability timing and filter applications because zero temperature coefficient resonators can be made when the plates are cut along the proper directions with respect to the crystallographic axes of quartz. Moreover, in an embodiment, a quartz resonator is a two-terminal device such that two electrical contacts are utilized for operation of the resonator. In this manner, a rectangular-shaped quartz resonator may be mounted to its package by clamping two points on the same end of the device. An example of such a rectangular-shaped quartz resonator will now be explored.

Figure 1B:
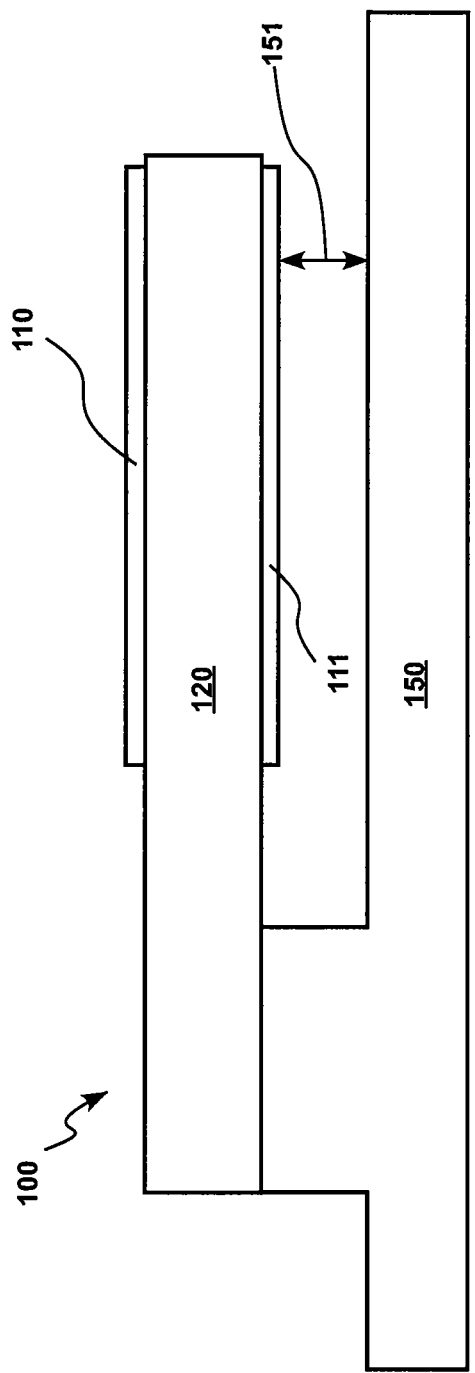
FIG. 1B is a side view of a quartz resonator in accordance with an embodiment.

With reference now to FIGS. 1A and 1B, a quartz resonator 100 in accordance with an embodiment is shown. Quartz resonator 100 includes a first electrode 110, a second electrode 111 separated from first electrode 110, and a quartz unit 120 disposed between first and second electrodes 110, 111, wherein quartz unit 120 is configured to be coupled with or affixed to a support substrate 150 such that a portion of quartz resonator 100 is separated from support substrate 150 by a distance 151 such that a portion of quartz unit 120 may resonate relative to support substrate 150.

In an embodiment, quartz resonator 100 also includes signal lines 130 extending from first and second electrodes 110, 111, respectively, wherein signal lines 130 are disposed on or adjacent to quartz unit 120, and wherein signal lines 130 are sized and positioned to be coupled or soldered to bond pads 140. Moreover, the signal line extending from the second electrode 111 is configured to electronically couple the second electrode with one of bond pads 140 by means of one or more vertical channels 160, which may be metal-filled vias. Furthermore, pursuant to one embodiment, a number of auxiliary pads 170 and interconnection pads 180 (for connecting to electronic interconnects) are also included.

The foregoing notwithstanding, in accordance with an exemplary implementation, after a quartz resonator, such as quartz resonator 100, is fabricated on a temperature-compensated crystal, great care is to be taken in mounting the resonator to a package or a support substrate so that relatively little or no stress is induced to cause strain in the quartz resonator. In particular, mounting strain on a quartz crystal can cause frequency shifts and slight rotation in the crystal to nullify the temperature compensation cut. Moreover, the performance of a temperature compensated quartz resonator, such as an AT-cut or SC-cut crystal, can be adversely affected by large mechanical stresses which can cause frequency shifts and create an effective rotation in the crystal cut angle to nullify the zero temperature coefficient of quartz. Such mechanical stresses are primarily caused by thermal expansion mismatch between the quartz crystal and its substrate and/or package. In particular, when the quartz resonator and its substrate experience a temperature change, stress is created in the quartz, owing to the higher CTE of quartz than that of the silicon substrate (a=$2.35 \times 10^{-6}$/°C. for silicon and $13.2 \times 10^{-6}$/°C. for quartz).

An embodiment of the present technology provides a thermal stress resistant resonator that includes a piezoelectric member positioned to resonate at a resonation frequency, wherein the piezoelectric member has one or more non-linear piezoelectric support members extending there from, the one or more piezoelectric support members being sized and shaped to absorb an amount of mechanical stress, such as stress caused by a thermal expansion mismatch as discussed above. In one example, the piezoelectric member and the one or more piezoelectric support members are all carved from a single piezoelectric component or crystal such that the fabricated resonator includes a piezoelectric member having mounting "feet" of relatively small cross section such that a reduced degree of thermal conductivity is achievable through these feet.

Figure 2A:
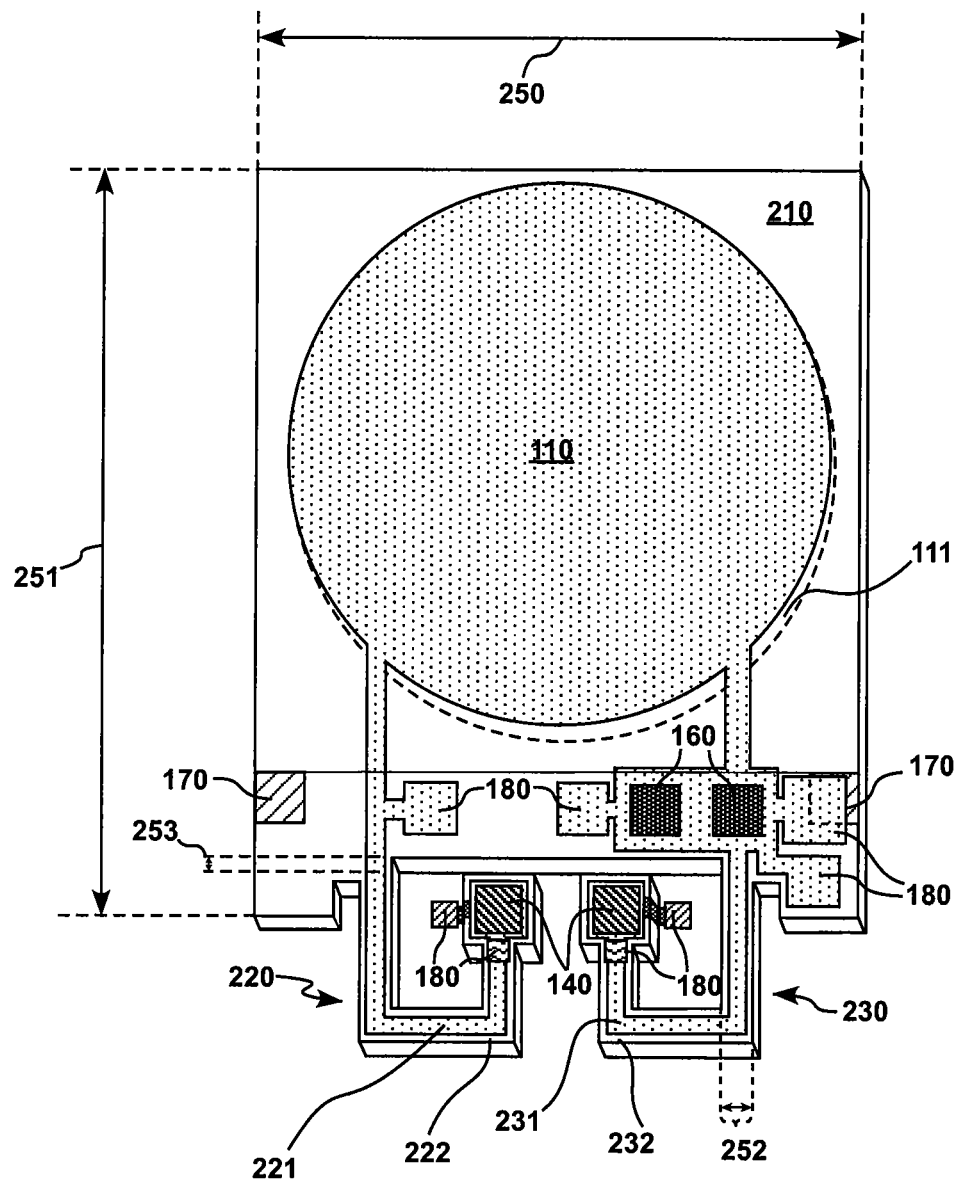
FIG. 2A is a top view of a thermal stress resistant resonator in accordance with an embodiment.
Figure 2B:
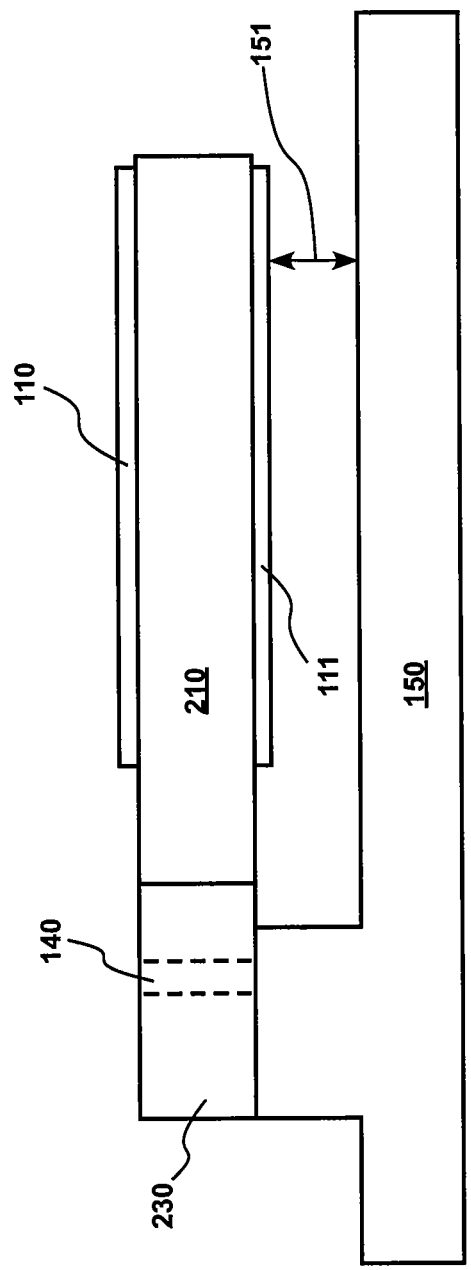
FIG. 2B is a side view of a thermal stress resistant resonator in accordance with an embodiment.
Figure 2C:
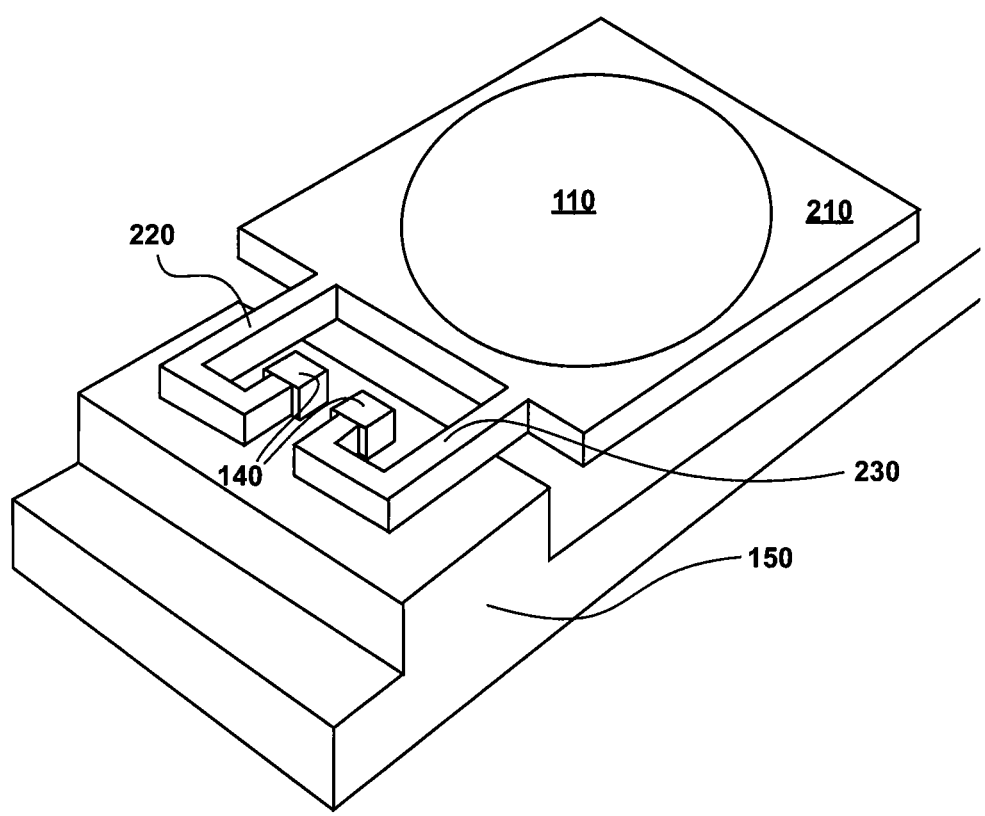
FIG. 2C is a perspective view of a thermal stress resistant resonator in accordance with an embodiment.

To further illustrate, and with reference now to FIGS. 2A-2C, a thermal stress resistant resonator 200 in accordance with an embodiment is shown. Thermal stress resistant resonator 200, which may be a quartz resonator, is shown as having folded spring supports to reduce mounting stress. Additionally, thermal stress resistant resonator 200 enables a relatively low mounting thermal stress to be realized even when the resonator is bonded to a substrate with a significantly different CTE from that of quartz.

To further illustrate, thermal stress resistant resonator 200, as shown in FIGS. 2A-2C, includes a first electrode 110, a second electrode 111 separated from first electrode 110, and a piezoelectric member 210 disposed between first and second electrodes 110, 111, wherein piezoelectric member 210 is configured to be coupled with or affixed to support substrate 150 such that a portion of thermal stress resistant resonator 200 is separated from support substrate 150 by a distance 151, and such that a portion of piezoelectric member 210 may resonate relative to support substrate 150.

In an embodiment, thermal stress resistant resonator 200 also includes a first spring support member 220 including a first non-linear signal line 221 extending from first electrode 110, and a first non-linear piezoelectric support member 222 extending from piezoelectric member 210, wherein first non-linear signal line 221 is disposed on first non-linear piezoelectric support member 222. Moreover, in the illustrated embodiment, thermal stress resistant resonator 200 further includes a second spring support member 230 including a second non-linear signal line 231 extending from the second electrode 111, and a second non-linear piezoelectric support member 232 extending from piezoelectric member 210, wherein second non-linear signal line 231 is disposed on second non-linear piezoelectric support member 232. Indeed, and with reference to FIGS. 2A and 2C, an embodiment provides that thermal stress resistant resonator 200 is attached to support substrate 150 only at the tops of first and second spring support members 220, 230. This leaves a portion of the device, including the resonator, cantilevered out into space.

Pursuant to one embodiment, first and second non-linear signal lines 221, 231 are coupled with or adhered to first and second non-linear piezoelectric support members 222, 232, and first and second non-linear piezoelectric support members 222, 232 are sized and positioned to provide mechanical support for first and second non-linear signal lines 221, 231. It is noted that this additional mechanical support may be useful, for example, when metal signal lines are implemented that are at least two orders of magnitude thinner than the material within first and second non-linear piezoelectric support members 222, 232.

With reference still to FIGS. 2A-2C, in an embodiment, first and second non-linear signal lines 221, 231 are sized and positioned to be coupled or soldered to bond pads 140 at respective ends of first and second non-linear piezoelectric support members 222, 232. Moreover, the signal line extending from the second electrode 111 is configured to electronically couple second electrode 111 with one of bond pads 140 by means of one or more vertical channels 160, which may be plated or metal-filled vias. Furthermore, in accordance with one embodiment, a number of auxiliary pads 170 and interconnection pads 180 (for connecting to electronic interconnects) are also included.

Thus, an embodiment provides a number of spring support members, such as those illustrated in FIGS. 2A-2C. It is noted that these spring support members are shaped to flex so as to absorb an amount of mechanical stress applied to these support members at bond pads 140. Indeed, in one embodiment, each of first and second spring support members 220, 230 are sized and positioned to absorb an amount of mechanical stress (e.g., mounting and/or thermal stress) and isolate piezoelectric member 210 from this mechanical stress. In this manner, the stress applied to the active region of the oscillator having spring support members is lower than would be achieved using the configuration shown in FIGS. 1A and 1B.

Moreover, in one embodiment, these spring support members also have a relatively small cross section such that they are shaped to dissipate heat conducted through pond ponds 140 so as to reduce the thermal conductivity from support substrate 150 to piezoelectric member 210. In this manner, the heat absorbed by the active region of the oscillator having spring support members is less than that which would be absorbed by the active region of the configuration shown in FIGS. 1A and 1B.

In an embodiment, piezoelectric member 210 and first and second non-linear piezoelectric support members 222, 232 are included within a same piezoelectric component, such that these members are not fabricated from different components and then subsequently coupled together. In this manner, the joints between piezoelectric member 210 and first and second non-linear piezoelectric support members 222, 232 will be relatively strong and durable because these components are fabricated from the same piece of material rather than being fabricated separately and then joined with a linking member or compound, which could impart a structural weakness.

Moreover, it is noted that various types of piezoelectric materials may be utilized in accordance with the present technology, and that the present technology is not limited to any specific type of piezoelectric material. For example, in one embodiment, piezoelectric member 210 and first and second non-linear piezoelectric support members 222, 232 are made of quartz. However, piezoelectric member 210 and first and second non-linear piezoelectric support members 222, 232 may be made of a piezoelectric material other than quartz.

With reference still to FIGS. 2A and 2C, it is shown that first and second spring support members 220, 230 are generally "J" shaped. It is noted, however, that the present technology is not limited to a generally "J" shaped geometry. For example, in one embodiment, one or more of first and second spring support members 220, 230 are generally "G", spiral or zigzag shaped. Thus, different geometric configurations may be implemented in accordance with the present technology for realizing a spring support member including both a non-linear signal line and a non-linear piezoelectric support member.

It is noted that a good resonator mounting design is one that shows minimal stress in the active region (e.g., the area of piezoelectric member 210 disposed between first and second electrodes 110, 111) where piezoelectric vibration occurs. Various stress models associated with the two resonators shown in FIGS. 1 and 2 will now be explored with respect to FIGS. 3 and 4, and FIGS. 5 and 6, respectively. Using Coventor's finite element thermo-mechanical model, the two designs were created and thermal stress distribution for the quartz resonator was calculated and rendered on the three-dimensional (3-D) models of each design for both 100° C. and 200° C., assuming that the mounting occurs at 20° C. and the substrate is silicon. The results are presented in FIGS. 3-6.

Figure 3:
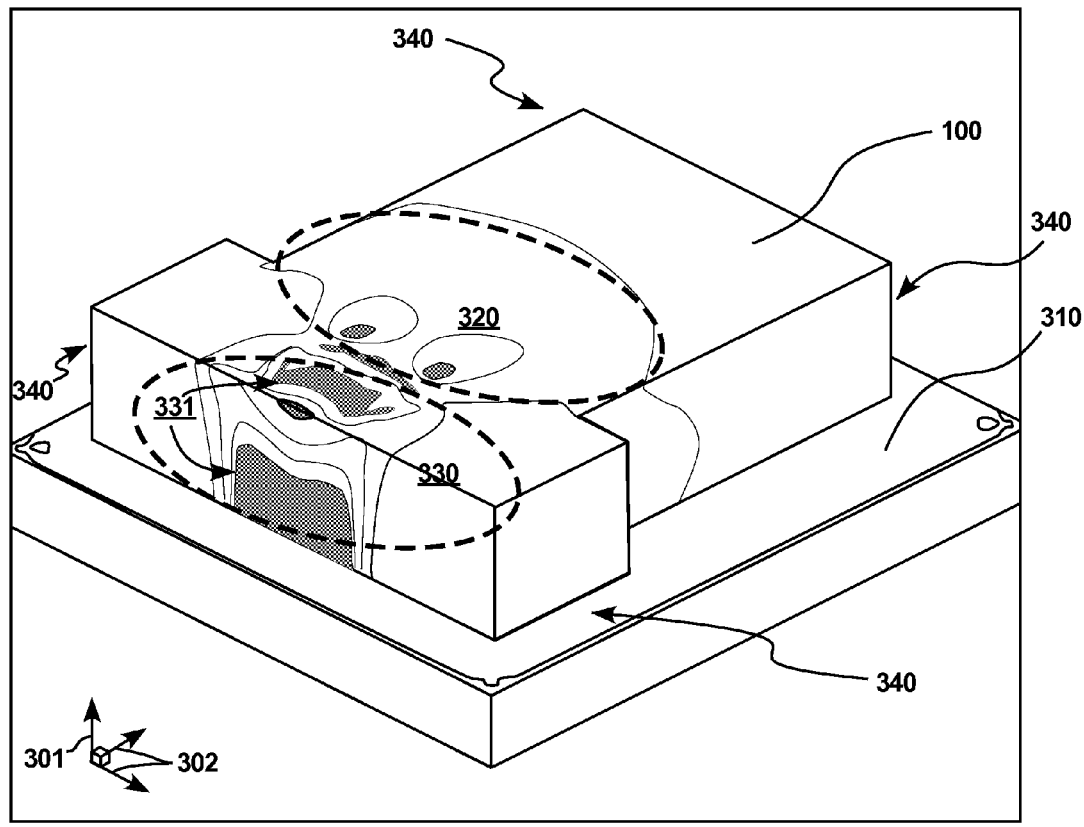
FIG. 3 is a first stress model of a quartz resonator in accordance with an embodiment.

With reference now to FIG. 3, a first stress model 300 of a quartz resonator 100 in accordance with an embodiment is shown. In particular, first stress model 300 illustrates a 3-D stress model of quartz resonator 100 with a horizontal mounting design as shown in FIGS. 1A and 1B, wherein quartz resonator 100 is mounted to a silicon substrate 310 and heated to 100° C. Additionally, a vertical direction vector 301 and horizontal direction vectors 302 are illustrated to provide a frame of reference for the vertical and horizontal directions referenced herein.

For this horizontal mounting design, the resonator electrode area or active region 320 of quartz resonator 100 experiences discernible thermal stress due to thermal mismatch between the quartz of quartz resonator 100 and the silicon of silicon substrate 310. In particular, a mounting region 330, which includes quartz bond pads, of quartz resonator 100 experiences a relatively significant degree of thermal stress at inner regions 331 as compared to outer regions 340 of quartz resonator. Much of the stress experienced by mounting region 330 is translated into active region 320, which adversely affects the operation of quartz resonator 100.

More specifically, and in accordance with an exemplary implementation, when quartz resonator 100 and silicon substrate 310 are subjected to a temperature of 100° C., the thermal stress experienced by inner regions is greater than 25 megapascals (MPa), while the negligible stress experienced by outer regions 340 is less than 0.1 MPa. As a consequence, the discernible thermal stress experienced by active region 320 is greater than 10 MPa.

Figure 4:
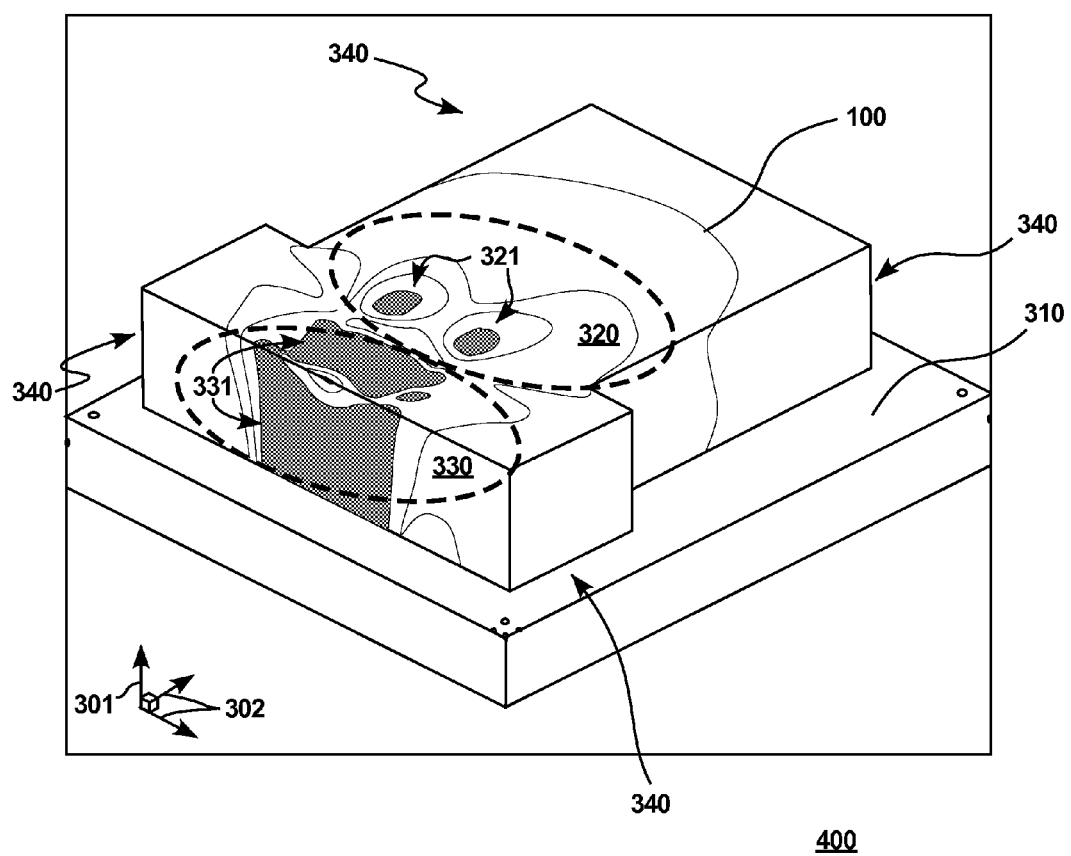
FIG. 4 is a second stress model of a quartz resonator in accordance with an embodiment.

With reference now to FIG. 4, a second stress model 400 of quartz resonator 100 in accordance with an embodiment is shown. In particular, second stress model 400 illustrates a 3-D stress model of quartz resonator 100 with a horizontal mounting design as shown in FIGS. 1A and 1B, wherein quartz resonator 100 is mounted to silicon substrate 310 and heated to 200° C.

In an exemplary implementation, at 200° C., mounting region 330 experiences an even larger amount of stress at inner regions 331 as compared to the example shown in FIG. 3. Moreover, the entire active region 320 is affected by the stress caused by the thermal mismatch between the quartz and silicon. Indeed, a stress level as high as 25 MPa may be experienced by active region 320, wherein this stress is concentrated in central regions 321. It is noted that such a relatively high level of thermal stress may significantly hinder effective operation of quartz resonator 100.

Figure 5:
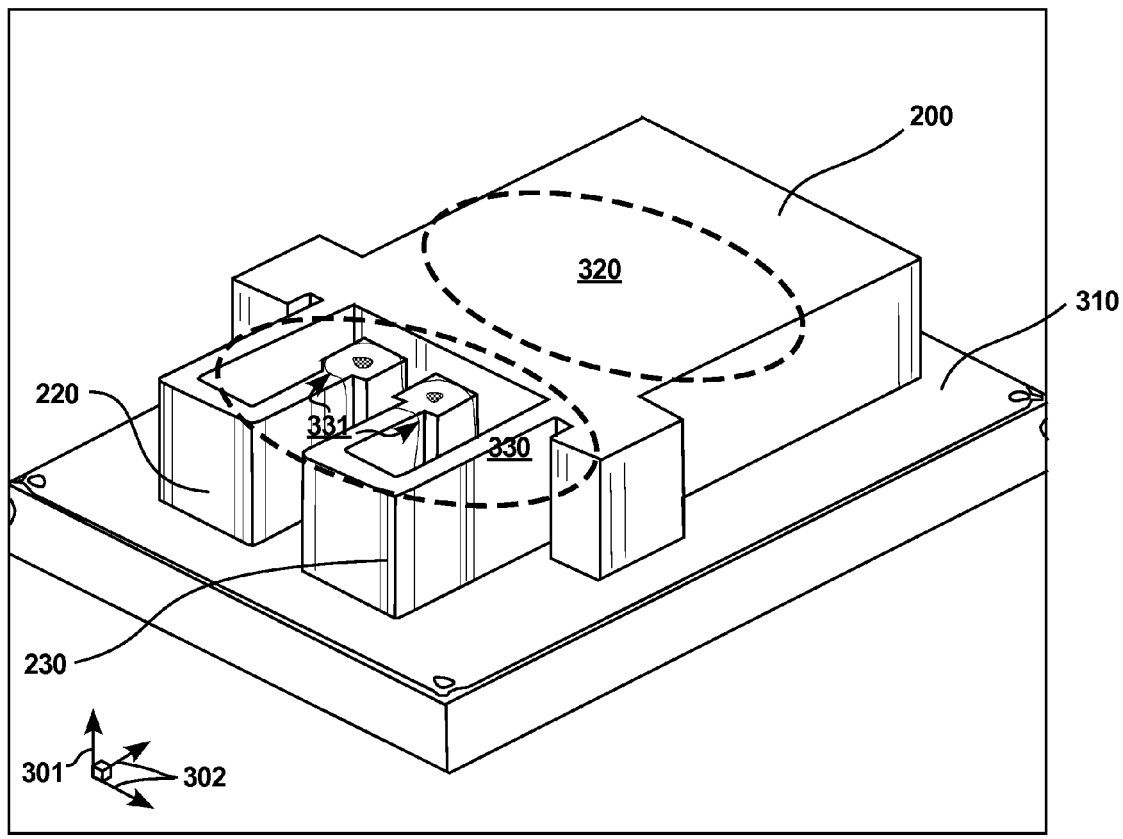
FIG. 5 is a first stress model of a thermal stress resistant resonator in accordance with an embodiment.

With reference now to FIG. 5, a first stress model 500 of thermal stress resistant resonator 200 in accordance with an embodiment is shown. In particular, first stress model 500 illustrates a 3-D stress model of thermal stress resistant resonator 200 with a folded spring mounting design as shown in FIGS. 2A-2C, wherein thermal stress resistant resonator 200 is mounted to silicon substrate 310 and heated to 100° C.

In an exemplary implementation, for the folded spring mounting design, active region 320 of thermal stress resistant resonator 200 does not experience any discernible thermal stress when the resonator and the silicon substrate are subjected to a temperature of 100° C. Rather, a slight stress is developed in mounting region 330, which does not affect the piezoelectric vibration. In particular, it is noted that first and second spring support members 220, 230 are configured to absorb an amount of stress to prevent this stress from being transferred to active region 320. In this manner, effective operation of thermal stress resistant resonator 200 may be maintained.

To further illustrate, thermal stress resistant resonator 200 is rigid in the vertical direction because of its thickness so that it doesn't significantly bend in this direction or have much out of plane motion. The "soft" or more compliant part of the thermal stress resistant resonator 200 is introduced in the horizontal plane, for example, with the machining of the springs. The thermally-induced mechanical stress is applied horizontally because the piezoelectric material of thermal stress resistant resonator 200 and the material of silicon substrate 310, which may be quartz and silicon respectively, expand and contract at different rates, causing a thermal expansion mismatch between silicon substrate 310 and thermal stress resistant resonator 200 which is mounted thereto. However, the aforementioned horizontal compliance mitigates this mechanical stress such that active region 320 does not experience any discernible degree of stress that would adversely affect the operation of thermal stress resistant resonator 200.

Figure 6:
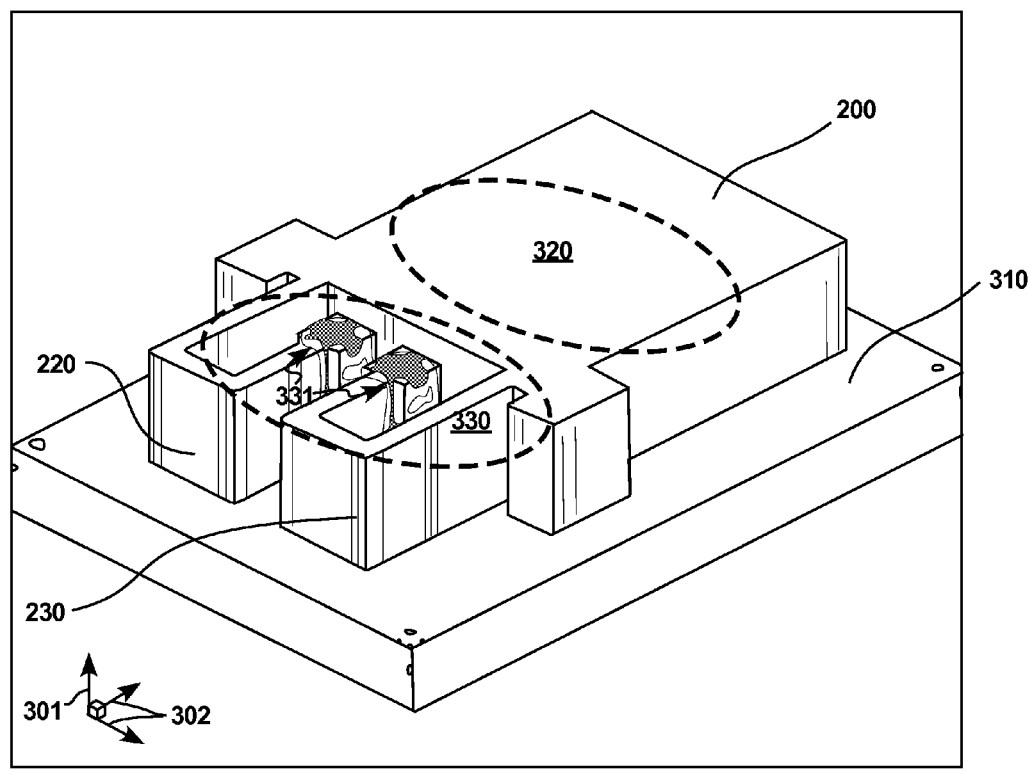
FIG. 6 is a second stress model of a thermal stress resistant resonator in accordance with an embodiment.

With reference now to FIG. 6, a second stress model 600 of thermal stress resistant resonator 200 in accordance with an embodiment is shown. In particular, second stress model 600 illustrates a 3-D stress model of thermal stress resistant resonator 200 with a folded spring mounting design as shown in FIGS. 2A-2C, wherein thermal stress resistant resonator 200 is mounted to silicon substrate 310 and heated to 200° C.

In an exemplary implementation, even at 200° C., the entire active region 320 is still unaffected by the stress caused by the thermal mismatch between the quartz and silicon. As one can see from the 3-D model, the stress level at the bond pads is extremely high (e.g., greater than 25 MPa). However, the stress is unable to easily propagate to active region 320 because it is isolated by the folded spring structures, which are illustrated as first and second spring support members 220, 230. Since stress reduction results from the folded spring structures, this design can be applied to various forms of quartz resonator mounting using, for example, adhesive, metal and solder bonds.

Thus, various embodiments of the present technology include folded spring structures including non-linear piezoelectric (e.g., quartz) support structures disposed adjacent to non-linear metal signal lines. Such an architecture addresses, for example, the thermal expansion mismatch introduced by the direct integration of piezoelectric resonators with silicon, silicon/germanium or a group III-V compound semiconductor substrate. Indeed, in an exemplary implementation, the quartz is bonded directly on top of a substrate with a different CTE, and a novel mounting design with the folded springs is implemented to mitigate the CTE mismatch between quartz and the substrate. It is noted, however, that the resonating portion of the piezoelectric resonator may include silicon, and that the present technology is not limited to a quartz structure.

It is noted that such an architecture would not be obvious in view of conventional designs for at least the following rationale. In an exemplary scenario, quartz resonators are relatively large (e.g., greater than several millimeters in dimension), and are made one at a time and mounted individually in a package. Indeed, pursuant to one example, a discrete quartz resonator may be packaged in a metal can that is more than 1.1 centimeter (cm) wide. Thermal expansion mismatch is dealt with by using relatively soft materials such as conductive epoxies to affix the quartz device. It is understood that this type of mounting is utilized in relatively large quartz resonators, and is often achieved manually on an individual basis.

Moreover, in accordance with one example, conductive epoxy is affixed at different positions on the quartz crystal to attach two relatively thick metal wires (e.g., approximately 0.43 millimeters (mm) in diameter) to the quartz so as to support the structure. With respect to this architecture, the use of folded quartz springs would not be obvious because such discrete quartz resonators are formed in either circular or rectangular shapes, and the metal wire attachment with the aforementioned epoxy constitutes a sufficient mounting architecture because the resonator does not reside on top of a substrate. Thus, there's no thermal expansion mismatch between the quartz and substrate that would hinder the active region of the quartz resonator. Therefore, for such discrete quartz resonators, the non-linear quartz supports would not be necessary, and therefore would not be desired.

Furthermore, forming the non-linear quartz supports would require an additional number of extra processing steps, such as the use of a handle wafer fabrication technique. Thus, not only would a person skilled in the art not be motivated to modify the conventional designs to implement a folded spring structure, such a person would in fact be motivated to not implement the features at issue because of the additional cost and complexity associated with the fabrication process that would be implemented to achieve such an architecture. Thus, a quartz spring support structure would not be obvious for traditional quartz manufacturers at least because they have conductive epoxies at their disposal and etching a spring structure would not be an easy feat for them.

The foregoing notwithstanding, it is noted that the present technology may be applied to both large (e.g., dimensions of cm's) and small (e.g., dimensions of 10's of micrometers ($\mu$m)) quartz resonators, whereas the aforementioned discrete mounting is associated with resonators larger than a few mm's. Indeed, the present technology may be implemented, for example, at wafer level for hundreds of small (e.g., less than 1 mm) quartz devices simultaneously. However, although the present technology is not limited to any specific physical dimensions, an embodiment provides that a thermal stress resistant resonator as disclosed herein may have a top horizontal dimension (such as horizontal length 250 shown in FIG. 2A) of approximately 1.8 to 2 mm and a side vertical dimension (such as vertical length 251 shown in FIG. 2A) of approximately 2.2 mm. Additionally, a width of the piezoelectric spring (such as piezoelectric spring width 252 shown in FIG. 2A) may be approximately 100 µm, with a distance between the end of the piezoelectric spring and the piezoelectric member (such as separation distance 253 shown in FIG. 2A) being approximately 70 µm.

Thus, an embodiment provides that a number of non-linear "feet" are carved from the same piece of material as the resonator, the feet being monolithic with the resonator, such that the folded spring structures and the resonator are each part of a single crystal. As previously noted, different geometries may be implemented for the folded spring structures in accordance with the present technology. For purposes of illustration and example, various exemplary geometries will now be explored. However, the present technology is not limited to these exemplary geometries.

Figure 7A:
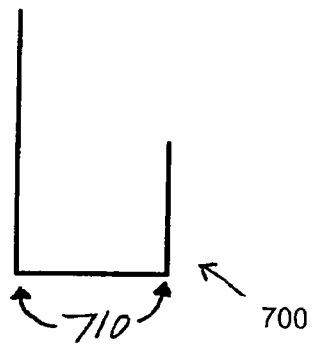
FIG. 7A is a diagram of a first spring shape in accordance with an embodiment.

With reference now to FIG. 7A, a first spring shape 700 in accordance with an embodiment is shown. First spring shape 700 is illustrated as being generally "J" shaped, with a number of corner edges 710 formed therein. Thus, in an embodiment, one or more of first and second spring support members 220, 230 of thermal stress resistant resonator 200 are generally "J" shaped with corner edges 710.

Figure 7B:
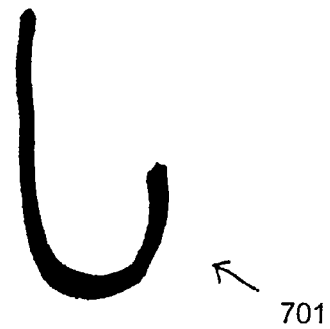
FIG. 7B is a diagram of a second spring shape in accordance with an embodiment.

With reference now to FIG. 7B, a second spring shape 701 in accordance with an embodiment is shown. Second spring shape 701 is illustrated as being generally "J" shaped, but without corner edges 710 shown in FIG. 7A. Thus, in an embodiment, one or more of first and second spring support members 220, 230 of thermal stress resistant resonator 200 are generally "J" shaped without corner edges 710.

Figure 7C:
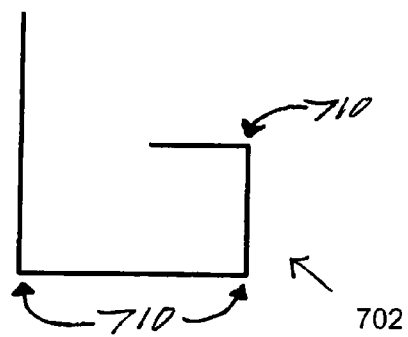
FIG. 7C is a diagram of a third spring shape in accordance with an embodiment.

With reference now to FIG. 7C, a third spring shape 702 in accordance with an embodiment is shown. Third spring shape 702 is illustrated as being generally "G" shaped, with a number of corner edges 710 formed therein. Thus, in an embodiment, one or more of first and second spring support members 220, 230 of thermal stress resistant resonator 200 are generally "G" shaped with corner edges 710.

Figure 7D:
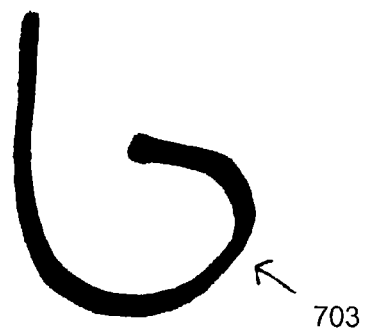
FIG. 7D is a diagram of a fourth spring shape in accordance with an embodiment.

With reference now to FIG. 7D, a fourth spring shape 703 in accordance with an embodiment is shown. Fourth spring shape 703 is illustrated as being generally "G" shaped, but without corner edges 710 shown in FIG. 7C. Thus, in an embodiment, one or more of first and second spring support members 220, 230 of thermal stress resistant resonator 200 are generally "G" shaped without corner edges 710.

Figure 7E:
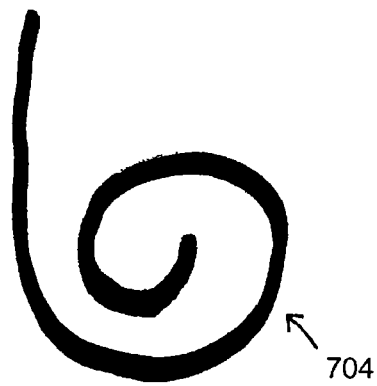
FIG. 7E is a diagram of a fifth spring shape in accordance with an embodiment.

Similarly, and with reference now to FIG. 7E, a fifth spring shape 704 in accordance with an embodiment is shown. Fifth spring shape 704 is illustrated as being generally spiral shaped. Thus, in an embodiment, one or more of first and second spring support members 220, 230 of thermal stress resistant resonator 200 are generally spiral shaped.

Figure 7F:
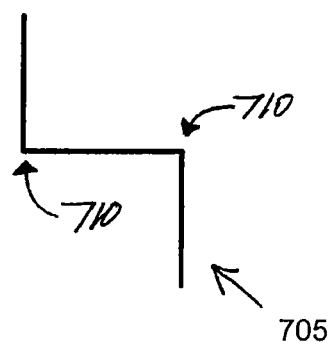
FIG. 7F is a diagram of a sixth spring shape in accordance with an embodiment.

With reference now to FIG. 7F, a sixth spring shape 705 in accordance with an embodiment is shown. Sixth spring shape 705 is illustrated as being generally zigzag shaped, with a number of corner edges 710 formed therein. Thus, in an embodiment, one or more of first and second spring support members 220, 230 of thermal stress resistant resonator 200 are generally zigzag shaped with corner edges 710.

Figure 7G:
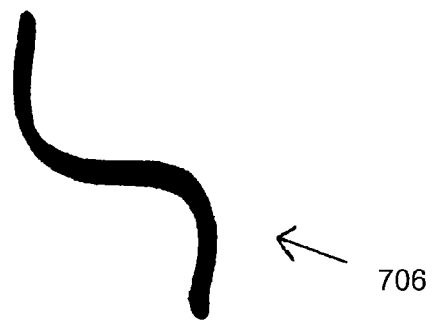
FIG. 7G is a diagram of a seventh spring shape in accordance with an embodiment.

With reference now to FIG. 7G, a seventh spring shape 706 in accordance with an embodiment is shown. Seventh spring shape 706 is illustrated as being generally zigzag shaped, but without corner edges 710 shown in FIG. 7F. Thus, in an embodiment, one or more of first and second spring support members 220, 230 of thermal stress resistant resonator 200 are generally zigzag shaped without corner edges 710.

Exemplary Methodologies

Various exemplary methods of fabrication will now be discussed. It is noted, however, that the present technology is not limited to these exemplary embodiments.

Figure 8:
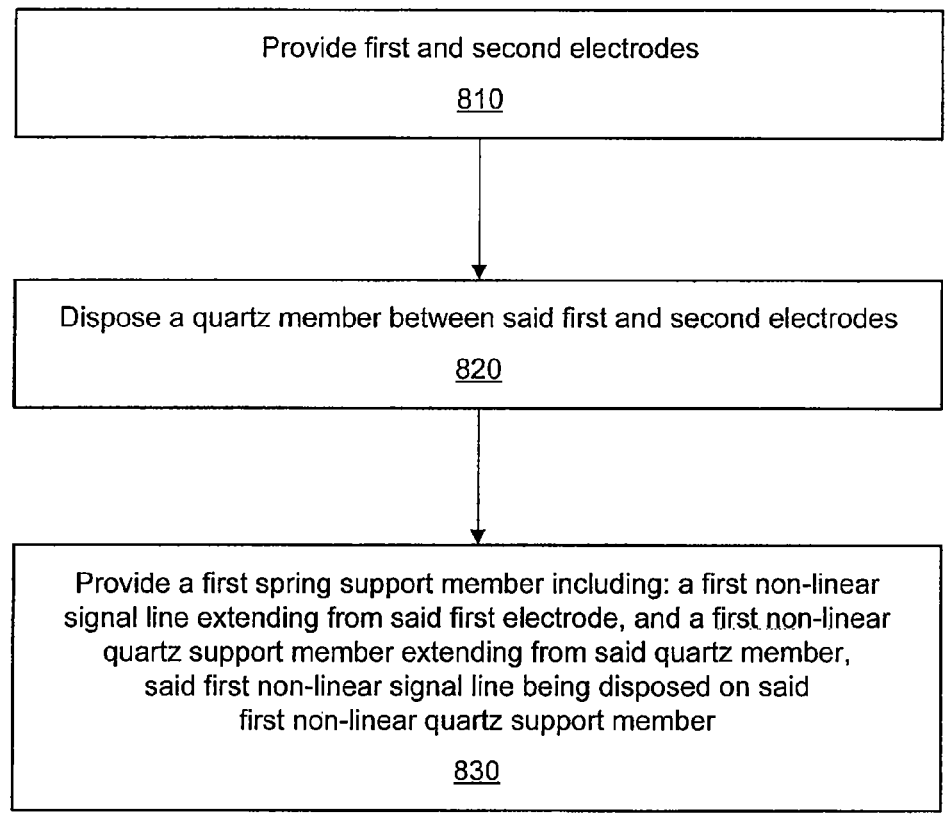
FIG. 8 is a flowchart of a method of fabricating a thermal stress resistant resonator in accordance with an embodiment.

With reference now to FIG. 8, a method 800 of fabricating a thermal stress resistant resonator in accordance with an embodiment is shown. Method 800 includes providing first and second electrodes 810, disposing a quartz member between the first and second electrodes 820, and providing a first spring support member including: a first non-linear signal line extending from the first electrode, and a first non-linear quartz support member extending from the quartz member, the first non-linear signal line being disposed on the first non-linear quartz support member 830.

Thus, method 800 includes the provision of a first spring support member. In one embodiment, this first spring support member is a folded spring structure that may be fabricated using a handle wafer process, such as that detailed in U.S. Pat. No. 7,237,315, which is incorporated herein by reference in its entirety. However, other fabrication techniques may also be implemented in accordance with the present technology.

Moreover, it is noted that the thermal stress resistant resonator may be fabricated to include more than one spring support member. For example, an embodiment provides that method 800 further includes providing a second spring support member including: a second non-linear signal line extending from the second electrode, and a second non-linear quartz support member extending from the quartz member, the second non-linear signal line being disposed on the second non-linear quartz support member.

In an embodiment, the quartz member and the first and second non-linear support members are formed from the same piece of piezoelectric material. To illustrate, in an embodiment, method 800 includes selecting a piezoelectric member, and shaping the piezoelectric member, such as by plasma or chemical etching, to fabricate the quartz member and the first and second non-linear quartz support members. In this manner, the joints between the quartz member and the first and second non-linear quartz support members will be relatively strong and durable because these components are fabricated from the same piece of material rather than being fabricated separately and then joined with a linking member or compound. Furthermore, for relatively small-scale devices, this method of fabrication is more efficient and economical.

In one embodiment, method 800 includes selecting respective shapes for the first and second spring support members to configure the first and second spring support members to absorb an amount of mechanical stress and isolate the quartz member from the mechanical stress. It is noted that various geometric shapes for achieving such a configuration may be implemented in accordance with the present technology. For example, in an embodiment, method 800 includes shaping the first and second spring support members to be generally "J", "G", spiral or zigzag shaped, such as previously discussed. However, these spring support members may also be formed in accordance with other geometries. Thus, it is noted that the spring support members may be formed to adopt specific geometries, such as those disclosed herein or obvious variations thereof.

The foregoing notwithstanding, in an embodiment, method 800 includes selecting respective shapes for the first and second non-linear signal lines to configure the first and second non-linear signal lines to be coupled or soldered to bond pads of a support substrate at respective ends of the first and second non-linear quartz support members. In this manner, an embodiment provides that the first non-linear quartz support member is shaped substantially similar to the first non-linear signal line disposed thereon such that the first non-linear signal line may be coupled or soldered to a bond pad of a support substrate at an end of the first non-linear quartz support member positioned adjacent to the bond pad. Similarly, pursuant to one embodiment, the second non-linear quartz support member is shaped substantially similar to the second non-linear signal line disposed thereon such that the second non-linear signal line may be coupled or soldered to a bond pad of a support substrate at an end of the second non-linear quartz support member positioned adjacent to the bond pad.

Summary Concepts

It is noted that the foregoing discussion has presented at least the following concepts:

1. A thermal stress resistant resonator including or comprising:
a piezoelectric member having one or more non-linear piezoelectric support members extending there from.

2. The thermal stress resistant resonator of claim 1, wherein the piezoelectric member and the first non-linear piezoelectric support member are included or comprised within a same piezoelectric component.

3. The thermal stress resistant resonator of claim 1, wherein at least one of the one or more non-linear piezoelectric support members are generally "J", "G", spiral or zigzag shaped.

4. A thermal stress resistant resonator including or comprising:
a first electrode;
a second electrode separated from the first electrode;
a piezoelectric member disposed between the first and second electrodes; and
a first spring support member including:
a first non-linear signal line extending from the first electrode; and
a first non-linear piezoelectric support member extending from the piezoelectric member, the first non-linear signal line being disposed on or adjacent to the first non-linear piezoelectric support member.

5. The thermal stress resistant resonator of claim 4, wherein the piezoelectric member and the first non-linear piezoelectric support member are included or comprised within a same piezoelectric component.

6. A thermal stress resistant resonator including or comprising:
a first electrode;
a second electrode separated from the first electrode;
a quartz member disposed between the first and second electrodes; and
a first spring support member including:
a first non-linear signal line extending from the first electrode; and
a first non-linear quartz support member extending from the quartz member, the first non-linear signal line being disposed on or adjacent to the first non-linear quartz support member.

7. The thermal stress resistant resonator of claim 6, further including or comprising:
a second spring support member including:
a second non-linear signal line extending from the second electrode; and
a second non-linear quartz support member extending from the quartz member, the second non-linear signal line being disposed on or adjacent to the second non-linear quartz support member.

8. The thermal stress resistant resonator of claim 7, wherein one or more of the first and second spring support members are generally "J", "G", spiral or zigzag shaped.

9. The thermal stress resistant resonator of claim 7, wherein each of the first and second spring support members are sized and positioned to absorb an amount of mechanical stress and isolate the quartz member from the mechanical stress.

10. The thermal stress resistant resonator of claim 7, wherein the first and second non-linear signal lines are sized and positioned to be coupled or soldered to bond pads of a support substrate at respective ends of the first and second non-linear quartz support members.

11. A method of fabricating a thermal stress resistant resonator, the method including or comprising:
providing first and second electrodes;
disposing a quartz member between the first and second electrodes; and
providing a first spring support member including:
a first non-linear signal line extending from the first electrode; and
a first non-linear quartz support member extending from the quartz member, the first non-linear signal line being disposed on or adjacent to the first non-linear quartz support member.

12. The method of claim 11, further including or comprising:
providing a second spring support member including:
a second non-linear signal line extending from the second electrode; and
a second non-linear quartz support member extending from the quartz member, the second non-linear signal line being disposed on or adjacent to the second non-linear quartz support member.

13. The method of claim 12, further including or comprising:
shaping the first and second spring support members to be generally "J", "G", spiral or zigzag shaped.

14. The method of claim 12, further including or comprising:
selecting a piezoelectric member; and
shaping the piezoelectric member to fabricate the quartz member and the first and second non-linear quartz support members.

15. The method of claim 12, further including or comprising:
selecting respective shapes for the first and second spring support members to configure the first and second spring support members to absorb an amount of mechanical stress and isolate the quartz member from the mechanical stress.

16. The method of claim 12, further including or comprising:
selecting respective shapes for the first and second non-linear signal lines to configure the first and second non-linear signal lines to be coupled or soldered to bond pads of a support substrate at respective ends of the first and second non-linear quartz support members.

Although various exemplary embodiments of the present technology are described herein in a language specific to structural features and/or methodological acts, the subject matter defined in the appended claims is not necessarily limited to the specific features or acts described above. Rather, the specific features and acts described above are disclosed as exemplary forms of implementing the claims.

What is claimed is:

1. A thermal stress resistant resonator comprising:
a monolithic piezoelectric member having at least two separate folded spring piezoelectric support members integrally extending therefrom, wherein the monolithic piezoelectric member and the folded spring piezoelectric support members are part of a single piece of shear mode resonating AT- or SC-cut quartz; and wherein
each of the at least two folded spring piezoelectric support members comprises at least two arms extending generally along a first direction, connected by a third arm extending generally along a second direction perpendicular to the first direction.

2. The thermal stress resistant resonator of claim 1, wherein at least one of said one or more folded spring piezoelectric support members are generally "J", "G", spiral or zigzag shaped.

3. A thermal stress resistant resonator comprising:
a monolithic piezoelectric member disposed between first and second electrodes; and
a first folded spring support member including:
a first non-linear signal line extending from said first electrode; and
a first piezoelectric support member integrally extending from said monolithic piezoelectric member, said first non-linear signal line being disposed on or adjacent to said first piezoelectric support member; and
a second folded spring support member including:
a second non-linear signal line extending from said second electrode; and
a second piezoelectric support member integrally extending from said monolithic piezoelectric member separately from said first piezoelectric support member, said second non-linear signal line being disposed on or adjacent to said second piezoelectric support member;
wherein the monolithic piezoelectric member and the first and second support members comprise a single piece of shear mode resonating AT- or SC-cut quartz and wherein each of the first and second support members comprises at least two arms extending generally along a first direction, connected by a third arm extending generally along a second direction perpendicular to the first direction.

4. A thermal stress resistant resonator comprising:
a monolithic quartz member disposed between first and second electrodes; and a first folded spring support member including:
a first non-linear signal line extending from said first electrode; and
a first quartz support member integrally extending from said monolithic quartz member, said first non-linear signal line being disposed on or adjacent to said first non-linear quartz support member;
a second non-linear signal line extending from said second electrode; and
a second quartz support member integrally extending from said monolithic quartz member separately from the first quartz support member, said second non-linear signal line being disposed on or adjacent to said second non-linear quartz support member;
wherein the monolithic quartz member and the first and second quartz support member comprise each a single piece of shear mode resonating AT- or SC-cut quartz; and
wherein each of the first and second support members comprises at least two arms extending generally along a first direction, connected by a third arm extending generally along a second direction perpendicular to the first direction.

5. The thermal stress resistant resonator of claim 4, wherein one or more of said first and second spring support members are generally "J", "G", spiral or zigzag shaped.

6. The thermal stress resistant resonator of claim 4, wherein each of said first and second spring support members are sized and positioned to absorb an amount of mechanical stress and isolate said quartz member from said mechanical stress.

7. The thermal stress resistant resonator of claim 4, wherein said first and
second nonlinear signal lines are sized and positioned to be coupled or soldered to bond pads of a support substrate at respective ends of said first and second non-linear quartz support members.

8. A method of fabricating a thermal stress resistant resonator, said method comprising:
providing first and second electrodes;
disposing a quartz member between said first and second electrodes; and providing a first spring support member including:
a first non-linear signal line extending from said first electrode; and
a first non-linear quartz support member extending from said quartz member, said first non-linear signal line being disposed on or adjacent to said first non-linear quartz support member; the method further comprising:
providing a second spring support member including:
a second non-linear signal line extending from said second electrode; and
a second non-linear quartz support member extending separately from said first non-linear quartz support member from said quartz member, said second non-linear signal line being disposed on or adjacent to said second nonlinear quartz support member;
wherein the quartz member and the first and second quartz support member form part of a single piece of shear mode resonating AT- or SC-cut quartz; and wherein each of the first and second support members comprises at least two arms extending generally along a first direction, connected by a third arm extending generally along a second direction perpendicular to the first direction.

9. The method of claim 8, further comprising:
shaping said first and second spring support members to be generally "J", "G", spiral or zigzag shaped.

10. The method of claim 8, further comprising: selecting a piezoelectric member; and
shaping said piezoelectric member to fabricate said quartz member and said first and second non-linear quartz support members.

11. The method of claim 8, further comprising:
selecting respective shapes for said first and second spring support members to configure said first and second spring support members to absorb an amount of mechanical stress and isolate said quartz member from said mechanical stress.

12. The method of claim 8, further comprising:
selecting respective shapes for said first and second non-linear signal lines to configure said first and second non-linear signal lines to be coupled or soldered to bond pads of a support substrate at respective ends of said first and second non-linear quartz support members.

* * * * *